United States Patent [19]

Laridon et al.

[11] 4,282,309

[45] Aug. 4, 1981

[54] PHOTOSENSITIVE COMPOSITION CONTAINING AN ETHYLENICALLY UNSATURATED COMPOUND, INITIATOR AND SENSITIZER

[75] Inventors: Urbain L. Laridon, Wilrijk; Walter F. DeWinter, s'-Gravenwezel; Hendrik E. Kokelenberg, Merksem, all of Belgium

[73] Assignee: Agfa-Gevaert, N.V., Mortsel, Belgium

[21] Appl. No.: 106,166

[22] Filed: Dec. 21, 1979

[30] Foreign Application Priority Data

Jan. 24, 1979 [GB] United Kingdom ............... 02550/79

[51] Int. Cl.$^3$ .............................................. G03C 1/68
[52] U.S. Cl. .................................... 430/281; 430/286; 430/287; 430/288; 430/920; 204/159.23; 204/159.15
[58] Field of Search ............... 430/281, 286, 287, 288, 430/913, 920; 204/159.15, 159.23

[56] References Cited

U.S. PATENT DOCUMENTS

| 3,558,309 | 1/1971 | Laridon et al. | 430/281 |
| 3,870,524 | 3/1975 | Watanabe et al. | 430/281 |
| 4,062,686 | 12/1977 | Van Allan et al. | 430/286 |
| 4,171,977 | 10/1979 | Hasegawa et al. | 430/281 |

OTHER PUBLICATIONS

Encyclopedia of Polymer Science and Technology, Supplemental vol. 1, 1976, John Wiley & Son, Inc. p. 435.

*Primary Examiner*—Jack P. Brammer
*Attorney, Agent, or Firm*—A. W. Breiner

[57] ABSTRACT

A photosensitive composition of matter suited for the production of polymer resist images which composition comprises a mixture of:

(1) a photopolymerizable ethylenically unsaturated compound, (2) at least one oxime ester photopolymerization initiator, and (3) at least one sensitizer increasing the photopolymerization rate of said composition said sensitizer being defined in two general formulae said formulae including respectively a merocyanine dye, a zeromethine merocyanine dye, a carbostyril compound, an aryl-substituted 2-pyrazoline compound, an aryl-substituted oxazole compound, an aryl-substituted 1,2,4-triazole compound, an aryl-substituted 1,3,4-oxadiazole compound or an aryl-substituted-4-oxazolin-2-one compound.

10 Claims, No Drawings

PHOTOSENSITIVE COMPOSITION CONTAINING AN ETHYLENICALLY UNSATURATED COMPOUND, INITIATOR AND SENSITIZER

This invention relates to photosensitive compositions containing a photopolymerizable e.g. photocrosslinkable ethylenically unsaturated compound and an oxime ester photopolymerization initiator in admixture with a sensitizer.

Heretofore it has been known to prepare photopolymerisable compositions using addition polymerisable ethylenically unsaturated compounds. It is also known that the photopolymerisation of these compounds as such proceeds very slowly and therefore substances, called polymerization photoinitiators, are added to accelerate the polymerisation. In general, these additives function by absorption of photons causing fragmentation into radicals. The radicals react with the unsaturated compound and initiate a polymerisation or crosslinking process.

Efficient photoinitiation can be obtained with O-acylated oximinoketones (see U.S. Pat. No. 3,558,309 of Urbain Leopold Laridon and Gérard Albert Delzenne, issued Jan. 26, 1971 and Encyclopedia of Polymer Science and Technology, Supplement Vol. 1 (1976) John Wiley & Sons, Inc., p. 435). In the last reference Michler's ketone is mentioned as a so-called sensitizer in combination with photoinitiators such as benzoin, benzoin methyl ether, benzophenone and benzil.

There is a constant search for more effective photoinitiators and combinations of photoinitiators with sensitizers that can increase photopolymerisation rate and possibly have a broader spectral response.

According to the present invention a photosensitive composition is provided which comprises a mixture of (1) a photopolymerizable e.g. photocrosslinkable, ethylenically unsaturated compound, (2) at least one oxime ester photopolymerisation initiator, and (3) at least one sensitizer increasing the photopolymerisation rate of said composition, said sensitizer being within the scope of one of the following general formulae (A) and (B):

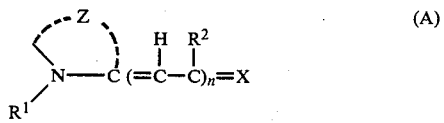

wherein:

Z represents the necessary atoms to close a nitrogen-containing heterocyclic nucleus including such nucleus carrying a fused-on aromatic nucleus including a fused-on substituted aromatic nucleus e.g. substituted with an electron-donating substituent e.g. a dialkylamino group, $R^1$ represents hydrogen or an alkyl group e.g. methyl or ethyl, $R^2$ represents hydrogen, an alkyl group e.g. methyl group or an aryl group e.g. phenyl, X represents oxygen, sulphur, a $C(CN)_2$ group or a heterocyclic ketomethylene nucleus e.g. as is known to be present in merocyanine dyes (cfr. British Pat. No. 904,332 filed July 5, 1957 by Gevaert Photo-Produkten N.V.) e.g. a 5-pyrazolone nucleus, a 5-isoxazolone nucleus, a 2,4,6-triketohexahydropyrimidine nucleus e.g. barbituric acid or thiobarbituric acid nucleus, a rhodanine nucleus or 2,4-imidazoline dione (hydantoin) nucleus, and n represents 0 or 1;

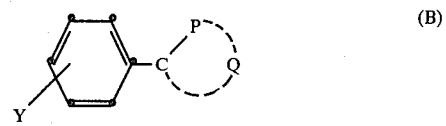

wherein:

Y represents hydrogen, halogen e.g. chlorine or iodine or a dialkylamino group e.g. a dimethyl amino of diethylamino group, P represents oxygen, NH or N-aryl e.g. N-phenyl, and P and Q represent together the necessary atoms to close a 5-membered unsaturated nitrogen containing heterocyclic nucleus carrying at least one further aryl substituent which may itself be further substituted e.g. with a dialkylamino group or carrying a fused-on aryl nucleus including a fused-on substituted aryl nucleus.

Examples of particularly suitable sensitizers according to general formula (B) are:

1,3-diaryl-2-pyrazolin,
3,5-diaryl-1,2,4-triazole,
2,5-diaryloxazole,
2-arylbenzoxazole,
2,5-diaryl-1,3,4-oxadiazole,
4,5-diaryl-4-oxazolin-2-one.

By the term "oxime ester photopolymerisation initiator" is meant a compound containing at least one oxime ester group of the following structure:

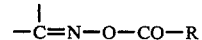

wherein R is an organic group. An alternative term for "oxime ester" is "O-acyloxime".

Specific oxime esters which can be used as photopolymerisation initiator can be represented by the following formulae:

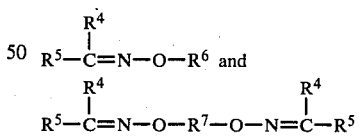

wherein:

$R^4$ represents an alkyl group consisting 1 or 2 carbon atoms, an aryl group, an alkaryl group, an aralkyl group, a hydroxy-substituted aralkyl group, or a substituted or unsubstituted acyl group, $R^5$ represents a hydrogen atom, an alkyl group comprising 1 or 2 carbon atoms, an aryl group, or a substituted or unsubstituted acyl group, or wherein $R^4$ and $R^5$ together represent the necessary atoms to form with the adjacent carbon atom a cycloalkyl group, a phenanthrone group, or an indanone group, $R^6$ represents a substituted or unsubstituted acyl group, and $R^7$ represents a diacyl group.

Preferably at least one of $R^4$ and $R^5$ is an unsubstituted or substituted acyl group. The acyl groups for $R^4$, $R^5$ and $R^6$ are preferably acyl groups derived from aliphatic or aromatic carboxylic or sulphonic acids e.g. benzoyl, phenylsulphonyl, naphthoyl, anthraquinonylcarbonyl, acetyl, propionyl, phenylacetyl, cinnamoyl, alkoxycarbonyl e.g. ethoxycarbonyl and N-substituted carbamoyl e.g. N-phenylcarbamoyl.

Particularly suitable compounds containing at least one oxime ester group, the so-called oxime esters or O-acyloximes, are those disclosed in U.S. Pat. No. 3,558,309, already mentioned hereinbefore. Particularly useful are the following:

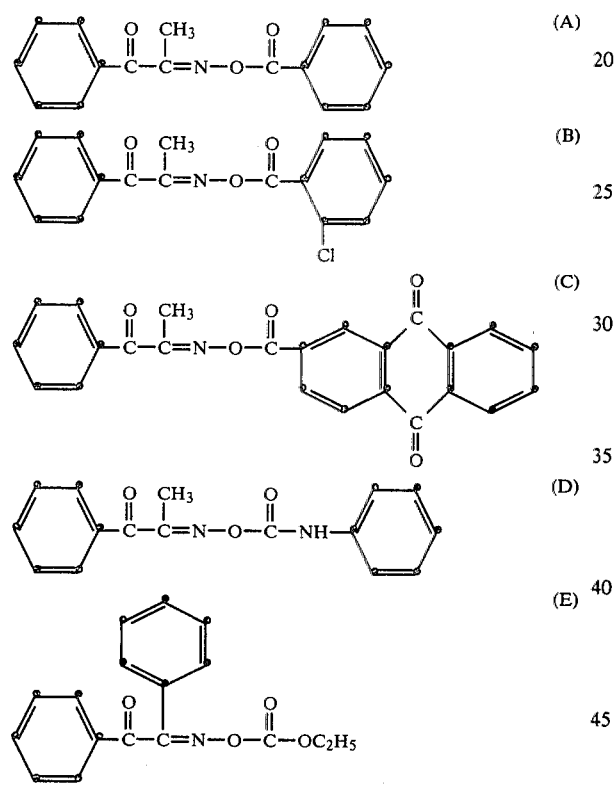

Particularly suitable sensitizers falling within the scope of formula (A) are merocyanine dyes and zeromethine merocyanine dyes, examples of which are the following:

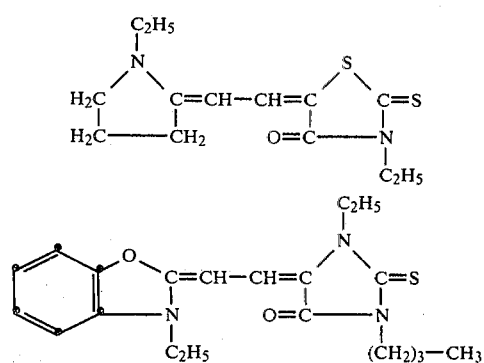

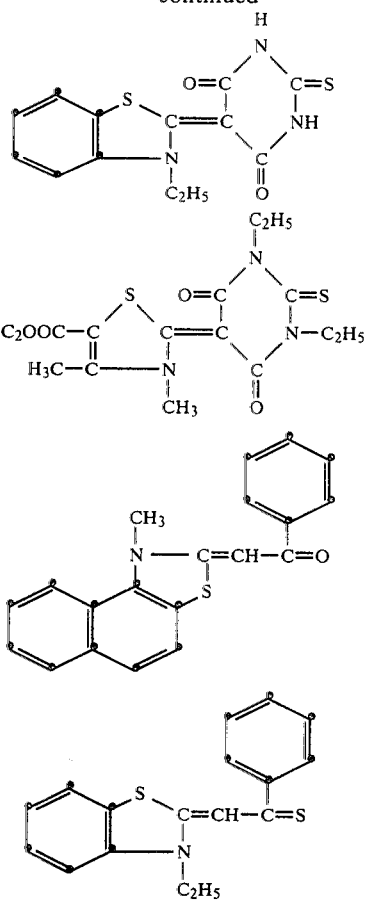

Further particularly suitable sensitizers falling within the scope of formula (A) are so-called carbostyril compounds, examples of which are the following:

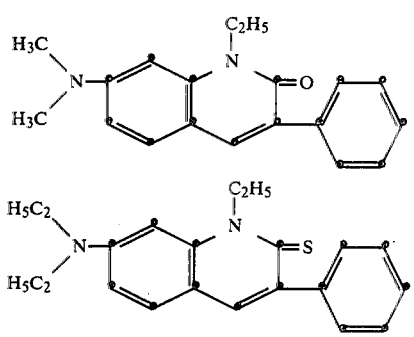

All the compounds of general formula (A) have the amidic chromophoric system

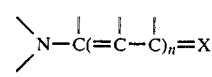

in which X is e.g. oxygen (ref. T. H. James, The Theory of the Photographic Process, 3rd Ed. (1966) The Macmillan Company, New York p. 201).

Particularly suitable sensitizers falling within the scope of formula (B) are the following:

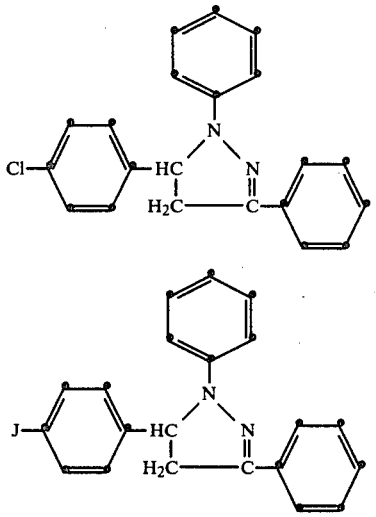

Other particularly suitable sensitizers falling within the scope of formula (B) are:

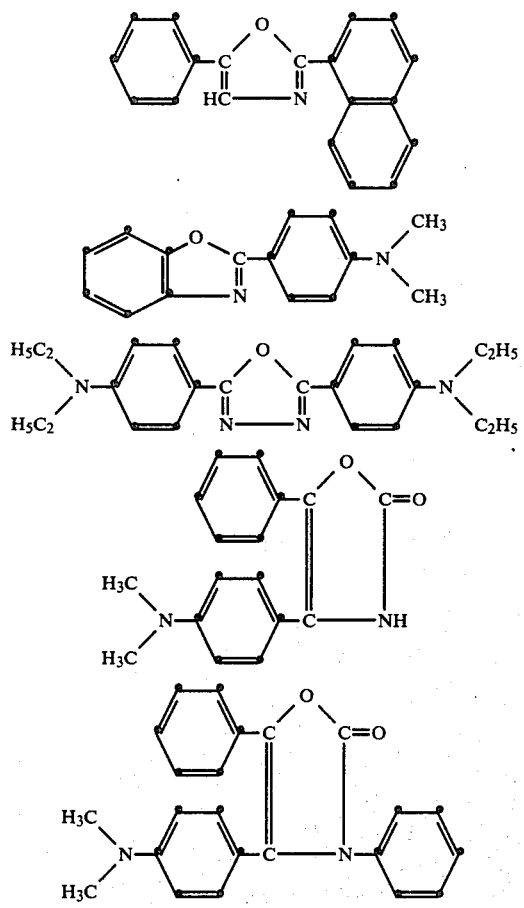

Many of the above sensitizers are known organic photoconductors and are described in U.S. Pat. No. 3,813,245 of Urbain Leopold Laridon and Jozef Willy van den Houte, issued May 28, 1974, as sensitizing agents for a photochromic composition containing a photosensitive polyhalogenated compound and a spiropyran compound as dye precursor for forming a pyrylium dye salt.

The photosensitive recording composition according to the present invention may be coated in the form of a layer on a support. It may comprise one or more ethylenically unsaturated polymerisable compounds e.g. styrene, acrylamide, methacrylamide, methyl methacrylate, diethylaminoethyl methacrylate, and acrylonitrile. When two of these monomers are used in the same photopolymerisable layer, copolymers are formed during the photopolymerisation. In the case where the photopolymerisable material is used together with a polymeric binding agent, still containing unsaturated bonds, graft copolymers are formed between the polymeric binder and the photopolymerised material.

The photopolymerisable composition may also comprise one or more photopolymerisable unsaturated compounds having more than one carbon-to-carbon double bond, e.g. two terminal vinyl groups, or a polymeric compound having ethylenic unsaturation. During photopolymerisation of these compositions usually cross-linking will occur by means of the plurally unsaturated compound. Examples of such polymeric compounds containing ethylenically unsaturation are, e.g., allyl esters of polyacrylic acid, maleic esters of polyvinyl alcohol, polyhydrocarbons still containing carbon-to-carbon double bonds, unsaturated polyesters, cellulose acetomaleates, and allylcellulose.

The photosensitive layer of the present invention preferably comprises plurally unsaturated photopolymerisable compounds examples of which are:
divinylbenzene,
diglycol diacrylates,
N,N'-alkylene bis-acrylamides,
triethyleneglycol-diacrylate,
triethyleneglycol dimethacrylate,
pentaerythritol triacrylate,
pentaerythritol tetraacrylate,
trimethylolpropane trimethacrylate,
bisphenol A-diacrylate.

The ratio of oxime ester to sensitizer can vary between wide limits and the most suitable ratio can easily be determined by running a series of tests. Generally the ratio is comprised between 1:1 and 10:1. The mixture of photopolymerisation initiator and sensitizer is generally used in an amount between 10 and 50% by weight with respect to the amount of photopolymerisable or photocrosslinkable material.

In order to produce a photographic recording material a base or support is coated with a solution of the ethylenically unsaturated organic compound in a solvent therefor, this solution containing in dissolved state or homogeneously dispersed therein a photopolymerisation initiating mixture of an oxime ester and of the sensitizer(s) as defined hereinbefore, whereupon the solvent or solvent mixture is eliminated by known means such as evaporation, leaving a more or less thin coating of the ethylenically unsaturated organic compound on the base or support. The thickness of the dried photosensitive recording layer is preferably in the range of 0.5 to 5 μm.

It is desirable that the photopolymerisable layer includes a binding agent for the photopolymerisable compound and the photopolymerisation initiating mixture of oxime ester and sensitizer. The choice of the binding agent is dependent on its solubility in solvents which can also be used as solvents for the ethylenically unsaturated compounds, for the oxime ester and the sensitizer.

Suitable binding agents are, e.g. polystyrene, polymethyl methacrylate, polyvinyl acetate, polyvinylbutyral, partially saponified cellulose acetate and other polymers that are soluble in solvents for the initiators and monomers. Water-soluble polymers can also be used such as gelatin, casein, starch, carboxymethylcellulose, and polyvinyl alcohol. The ratio of photopolymerisable monomer to binding agent obviously also influences the photopolymerisation. The larger this ratio the higher the photopolymerisation rate generally will be for a particular photopolymerisable compound.

In a preferred embodiment of the invention the photosensitive layer comprises as binding agent an alkali-soluble polymer. By the use of such binding agents the photosensitive recording layer, after exposure to light, may be developed in aqueous alkaline medium so that the use of expensive and sometimes inflammable organic solvents for washing away the unexposed areas of the photosensitive layer, is avoided.

Particularly useful alkali-soluble polymers are copolymers with units of unsaturated monocarboxylic acids, e.g. acrylic acid, methacrylic acid, and crotonic acid, unsaturated dicarboxylic acids e.g. maleic acid, fumaric acid, itaconic acid, and citraconic acid as well as half-esters and half-amides of these dicarboxylic acids. These unsaturated carboxylic acids are copolymerised with ethylenically unsaturated compounds, which are substantially insoluble in alkaline medium and which are present in the copolymer in such a proportion that the copolymer itself remains soluble in alkaline medium. Ethylenically unsaturated compounds that can be used for the copolymerisation are styrene and derivatives thereof, vinyl chloride, vinylidene chloride, vinyl esters such as vinyl acetate, acrylates, methacrylates, acrylonitrile, methacrylonitrile e.g. copoly(ethylene/maleic acid) and copoly(methyl methacrylate/methacrylic acid).

Especially suitable are the alkali-soluble copolymers of methyl methacrylate and methacrylic acid wherein the ratio by weight between the monomeric units is between 90:10 and 75:25, more preferably between 85:15 and 80:20, and wherein the intrinsic viscosity of the copolymers measured in tetrahydrofuran at 20° C. is between 0.05 and 0.20 dl/g, corresponding to molecular weights of about 7000 to 40,000.

These alkali-soluble copolymers of methylmethacrylate and methacrylic acid combine easy removability of the nonexposed portions with good mechanical strength i.e. resistance to abrasion of the exposed portions.

The photosensitive layer according to the present invention comprises according to the preferred embodiment a photopolymerisable ethylenically unsaturated (preferably plurally unsaturated) organic compound, examples of which have been given hereinbefore, a mixture of an oxime ester photopolymerisation initiator and a sensitizer as defined hereinbefore, and an alkali-soluble copolymer of methylmethacrylate and methacrylic acid as defined hereinbefore. The layer preferably has a thickness between 0.5 and 5 μm.

The proportions in the photosensitive layer of binding agent and of photopolymerisable compound are preferably such that an exposure of said layer to actinic radiation of maximum 1 minute can effect at room temperature (20° C.) a decrease in solubility of the exposed parts such that these parts do not dissolve in an aqueous solution (20° C.) of 0.5 to 3% by weight of sodium hydroxide within 20 seconds. Weight ratios of alkali-soluble polymer to photopolymerisable compound between 1:2 and 5:1 are preferred.

The amounts of oxime ester and of sensitizer added to the mixture of alkali-soluble polymer and of photopolymerisable compound may also be between wide limits. Good results are obtained with 0.5–5% by weight of sensitizer and 2.5–10% by weight of oxime ester, preferably 1.5–2.5% by weight of sensitizer and 5–7.5% by weight of oxime ester, based on the total weight of binding agent and photopolymerisable compound.

The base of the photosensitive recording material of this invention may be coated with a photosensitive layer at one or both sides and may be made of any material as long as it does not deleteriously affect the photopolymerisation process. Typical flexible sheet materials are paper supports, e.g., coated at one or both sides with an alpha-olefin polymer, e.g. polyethylene. It is also possible to use cellulose nitrate film, cellulose acetate film, poly(vinyl acetal) film, polystyrene film, poly(ethylene terephthalate) film, polycarbonate film, polyalpha-olefins such as polyethylene and polypropylene film, and related films such as a drawing film e.g. of the type described in the U.S. Pat. Nos. 3,115,420 of John M. Centa, Albert L. Van Stappen and Louis F. Vogt Jr., issued Dec. 24, 1963 and 3,627,563 of Raymond S. Richards, issued Dec. 14, 1971. The support is usually 0.05 to 0.15 mm in thickness.

If the base is made of a transparent resin or glass transparencies can be made starting from photosensitive layers containing dyes or pigments. These transparencies may be used for projection, e.g. with an overhead projector. If the support is an opaque paper, e.g. baryta coated paper, and the photosensitive layers contain dyes or pigments opaque colour proofs can be made by washing off. If the support is made of metal a photoresist can be prepared with a photosensitive coating according to the present invention, which resist may be used as etch-resist.

Metal bases or bases coated with metals e.g. zinc, and especially aluminium, are excellently suitable as base materials for a planographic printing plate. The base materials for planographic printing plates may contain more than one metal layer e.g. as in bimetal plates as described e.g. in the United Kingdom Pat. No. 936.913 filed Feb. 1, 1960 by Norlin N. or trimetal plates as described e.g. in the United Kingdom Pat. No. 1,210,301 filed Jan. 23, 1968 by Kalle A. G. For the production of a planographic printing plate there may be likewise used plates of stone or glass and specially treated sheets of paper or polymeric film supports coated with a metallic layer that in its turn is coated with the photosensitive recording layer. For use in the production of intaglio or relief printing plates, metal base materials suited for etching are used, e.g. metal plates or drums of zinc, copper, steel or an etchable magnesium alloy. For use in the production of printed circuits the photosensitive composition is applied, e.g. to a support copper layer, which can be easily etched.

In the production of miniaturized integrated electrical components the photosensitive composition serves to form a shielding pattern, e.g., on a semiconductor substrate or insulator wherein by techniques such as vapour deposition, oxidation, ion implantation, electrodeless deposition, ion-milling or etching, matter is added or removed to offer the desired electronic properties to the non-shielded material.

As is apparent from the above the photosensitive coating can be used in a large variety of applications.

Photosensitive materials according to the present invention are particularly suitable for the production of micro-images. For that purpose the photosensitive coatings may be applied to a substantially opaque, preferably relatively thin metal coating on a film support, the metal coating being etchable and thus serving as imaging layer. Particularly good results are obtained with tellurium and tellurium alloy coatings preferably having a thickness in the range 50 nm to 500 nm and bismuth coatings preferably having a thickness in the range 25 nm to 300 nm.

According to one embodiment in the composition of the metallic imaging layer tellurium alloys comprising at least 50 atomic percent of tellurium are used. Typical tellurium compositions, which are etchable with an aqueous hypochlorite solution are e.g. described in the published German Patent Application (DE-OS) No. 2,723,613 filed May 12, 1977 by Agfa-Gevaert A. G.

According to another and more preferred embodiment the imaging metal layer consists of bismuth. Bismuth possesses the advantage of directly adhering to organic resin supports such as a polyethylene terephthalate support when deposited thereon from bismuth vapour under reduced pressure conditions. Typical bismuth coatings have been described in DE-OS No. 2,723,613, already mentioned hereinbefore.

Vapour deposition techniques are sufficiently known to those skilled in the art e.g. of preparing photoconductive selenium coatings (see e.g. U.S. Pat. No. 3,874,917 of Charles Wood, John C. Schottmiller and Francis W. Ryan, issued Apr. 1, 1975 and U.S. Pat. No. 3,884,688 of John C. Schottmiller, Francis W. Ryan and Charles Wood, issued May 20, 1975.

Bismuth forms a black, non-light-reflecting coating showing no crazing and it provides a very high spectral density. Indeed, a bismuth layer already at a coating thickness of 80 nm shows a spectral density of about 3. A 100 nm bismuth layer has a spectral density of about 5.

A bismuth layer for a recording material according to the present invention is preferably applied to a polymeric film support, e.g. a sheet or belt. Preferably a polyethylene terephthalate support, e.g. of 0.07 to 0.1 mm thickness, is used.

The photosensitive recording materials according to the present invention are prepared by coating the ingredients forming the photosensitive layer to the selected substrate by a known coating technique, e.g. by spin-coating, whirl-coating, spraying, dip-coating, roller-coating, air-knife coating, doctor-blade coating, etc. The coating composition may comprise besides the ingredients referred to hereinbefore matting agents e.g. silica particles in association with urea-formaldehyde resin, polymethylmethacrylate particles, etc., antistatic agents, coating aids e.g. anionic and cationic surface active agents, silicon oils, etc.

Before their application in the form of a coating these ingredients are dissolved preferably in a low-boiling solvent, e.g. acetone, that after the coating step is removed by evaporation.

It is however not necessary to have all coating ingredients in dissolved state. Thus particularly good results are obtained by means of a photosensitive layer comprising a hydrophilic, macromolecular organic polymer dispersion medium including a dispersed phase containing:

(1) at least one ethylenically unsaturated monomer having a boiling point above 100° C. at normal atmospheric pressure and being capable of forming a high polymer by free-radical initiated, chain-propagating addition polymerization, and (2) in reactive association with said monomer at least one free-radical photoinitiating system as is presented by the combination of oxime ester and sensitizer according to the present invention.

Suitable monomers for that photopolymerization system are described e.g. in the U.S. Pat. No. 3,718,473 of Joseph Edmund Gervay and Peter Walker, issued Feb. 27, 1973. After photopolymerization the non-polymerized parts need not be removed by means of solvents.

The photopolymerized layer shows image-wise differentiation in permeability for etchant for the underlying support which are e.g. metal supports including bimetal and trimetal plates and film supports coated with metal layers as referred to hereinbefore.

The thickness of the dried photosensitive recording layer may be between 0.5 and 20 $\mu$m, preferably between 1 and 5 $\mu$m.

The photopolymerizable polymeric compositions according to the present invention are not only suitable for recording purposes but may be used in the preparation of radiation curable inks e.g. ultraviolet drying inks. Such inks and their use is described e.g. in IGC Monthly, May 1972 p. 4-6. These inks are normally liquid, solvent-free and non-volatile. The inks are dried by a photopolymerization system that embodies the formation of a cross-linked polymer from monomeric chemicals by the action of actinic radiation on the photoinitiator which in the present invention is used in conjunction with at least one of the described sensitizers. The photoinitiator has little effect on the composition until irradiated, and this makes possible an ink system of good storage stability. This is in sharp contrast to conventional curing with peroxide or redox catalysts, which have short pot life.

Furthermore on curing there is no release of volatile reaction by-products as is the case e.g. by using amino-formaldehyde and phenol-formaldehyde condensates that cure by releasing formaldehyde and water.

The present photosensitive recording material is useful for the production of a photoresist in a recording method comprising the steps of information-wise exposing to actinic radiation a photosensitive material comprising a base coated with a photosensitive layer as referred to hereinbefore whereby in the exposed areas at least one ethylenically unsaturated compound is polymerised, and removing the non-exposed or insufficiently exposed portions of the layer by washing with a solvent for the ethylenically unsaturated compound(s).

According to a particular embodiment said recording method is used to form metal images. Said method includes the steps of:

(1) information-wise exposing to actinic radiation, in particular UV-radiation, a recording material comprising a transparent film support bearing an opaque metal coating and thereover an alkali-soluble photosensitive layer as hereinbefore defined;

(2) overall contacting the photosensitive layer with an aqueous alkaline liquid to remove selectively the non-exposed or insufficiently exposed portions of the photosensitive layer; and (3) contacting the bared portions of the opque metal layer with a liquid that is capable of chemically removing said portions without removing the exposed portions of the photosensitive layer.

The exposure may be an exposure through a contacting transparent master pattern or a projection exposure.

The photosensitive recording composition of the invention may be exposed to any source of actinic radiation, more particularly radiation of wave-lengths in the range 250–400 nm, preferably 300–400 nm. Suitable light sources include carbon arcs, mercury vapour lamps, fluorescent lamps, argon glow lamps, photographic flood lamps and tungsten lamps. Moreover, ordinary daylight may also be used. Pulsed xenon lamps and tungsten lamps emitting to a minor amount in the ultraviolet region and mainly in the visible light range may likewise be used since some of the sensitizers such as the merocyanine dyes extend spectral absorption into the visible light range.

The concentration of alkaline substance, e.g. potassium hydroxide, used for developing the resist layer, i.e. for selectively removing the unexposed photosensitive layer portions, may vary widely. Thus for example 0.4 to 7.5% by weight aqueous solutions of potassium hydroxide may be used.

Other alkaline substances which may be used for washing away the non-exposed portions of the photosensitive layer include 0.25 to 5% aqueous solutions of sodium hydroxide and 1 to 10% aqueous solutions of potassium carbonate.

For the chemical etching of a tellurium-containing layer preferably aqueous solutions of 0.5 to 30% of sodium hypochlorite are used.

For the etching of a bismuth layer preference is given to aqueous acidic iron(III) chloride solution. The concentration of iron(III) chloride is, e.g., in the range of 5 to 20% by weight. Said solution contains preferably from 0.25 to 1% by weight of citric acid.

A likewise useful etching solution for the removal of bismuth is an aqueous solution containing 3 to 6% by weight of hydrogen peroxide and 5 to 10% by weight of sulphuric acid. Instead of hydrogen peroxide sodium perborate or urea peroxide, e.g. $NaBO_2.H_2O_2.3H_2O$ and $NH_2CONH_2.H_2O_2$ can be used.

The processing of the photo-exposed recording materials of the present invention is advantageously carried out in an automatic processing apparatus, in which the material is transported automatically through processing stations in which the removal of the still soluble portions of the photosensitive layer and the etching (if necessary) of the bared imaging layer portions take place in successive stations.

For example in a particularly suitable processing apparatus for use in the production of metal-images e.g. bismuth-images according to the present invention, a first station comprises a tray for holding an appropriate alkaline aqueous liquid, through which the exposed recording material is transported. After the alkaline development stage the surplus alkaline liquid absorbed in and adhering to the material is removed by passing the developed material through a second tray filled with plain water, whereupon the material is led through a third tray containing a suitable etch solution for the bared portions of the metallic imaging layer. Processing is completed by carrying the material through a fourth tray containing plain water for rinsing the material. Processing preferably proceeds at room temperature (about 18 to about 25° C.) but may proceed at higher temperatures. Care must be taken, however, not to damage the photosensitive layer.

The alkaline developing station and etching station can be arranged separately but preferably they are grouped in a compact unit, in which the recording material is carried automatically at a constant speed from the alkaline developing tray into the other trays.

The total processing for the formation of the metal images in said trays normally lasts but about 30 seconds at 20°–30° C. Taken with the high speed of the photosensitive layer requiring exposure times in the order of seconds, the present invention provides a rapid, highly reliable and convenient method for the formation of metal images.

A useful processing apparatus is e.g., a common 4-tray processing station as used in the known four-bath silver halide stabilisation processing (see e.g. G.B. Pat. No. 1,243,180 filed Oct. 11, 1967 by Gevaert-Agfa N. V.) more particularly the RAPIDOPRINT unit DD 1437 (RAPIDOPRINT is a trademark of AGFA-GEVAERT N. V. Belgium).

The present invention makes it possible to produce metal images with very high contrast and excellent resolution at low cost. So, mass production of microform images is made possible in a simple manner at high speed and half-tone images with high screen dot quality can be produced in a simple inexpensive equipment at low unit cost.

The synthesis of suitable alkali-soluble polymeric binding agents is exemplified in the following preparations:

Preparation 1

The following solution was formed:
methyl methacrylate: 40 g
methacrylic acid: 10 g
4,4'-azo-bis-4-cyanovaleric acid: 1.5 g
methanol: 500 ml This solution was refluxed for 24 hours under a nitrogen atmosphere while continuously stirring. After cooling the solution was poured into water. The white, powdery precipitate was isolated and was dried under vacuum. Yield: 45 g of co(methyl methacrylate/methacrylic acid), having an intrinsic viscosity in tetrahydrofuran (20° C.) of 0.155 dl/g. The copolymer comprised 18.4% by weight of methacrylic acid units.

Preparation 2

A solution of 45 g of methyl methacrylate, 5 g of methacrylic acid and 1.5 g of 4,4'-azo-bis-4-cyanovaleric acid in 500 ml of methanol was refluxed for 24 hours while stirring under a nitrogen atmosphere. After cooling the solution was poured into water and the white, powdery precipitate was isolated and dried under vacuum. Yield: 44 g of co(methyl methacrylate/methacrylic acid) having an intrinsic viscosity (20° C.) in tetrahydrofuran of 0.124 dl/g and comprising about 10% by weight of methacrylic acid units.

Preparation 3

A solution of 800 g of methyl methacrylate, 200 g of methacrylic acid and 30 g of 4,4'-azo-bis-4-cyanovaleric acid in 10 l of acetone was refluxed for 24 hours while stirring under nitrogen atmosphere. After cooling a solution was obtained having a viscosity of 1.25 mPa.s at 20° C. and having a copolymer concentration of 8% by weight. This solution can be used as such, without it being necessary to separate the copolymer. The separated copolymer had an intrinsic viscosiity in tetrahydrofuran (20° C.) of 0.173 dl/g and comprised 18.3% by weight of methacrylic acid units.

The invention will be illustrated by some specific examples, which are essentially non-limiting for the invention. All percentages are by weight, unless otherwise indicated:

EXAMPLE 1

The following solution was prepared by mixing:
co(methyl methacrylate-methacrylic acid) (82.5:17.5% by weight) having an intrinsic viscosity of 0.15 dl/g measured in tetrahydrofuran at 20° C.: 4 g
pentaerythritol triacrylate: 2 g
2,6-di-t-butyl cresol: 0.006 g
acetone: 180 ml
ethyleneglycol monomethyl ether: 20 ml To 10 ml of the obtained solution 15 mg of ketoxime ester (A) and 4.5 mg of one of the sensitizers 1 to 15 was added.

A solution containing only the indicated amount of ketoxime ester served as the control.

The solutions were separately coated at the same coating thickness on a bismuth layer which had been vapour deposited on a polyethylene terephthalate film. Coating was such that after drying for 15 minutes at 80° C. a photosensitive layer of about 1.5 μm was obtained.

The different photosensitive layers were exposed for 20 seconds in a SPEKTRA-PROOF (Trade Mark) apparatus using an iron(III) chloride doped high pressure mercury vapour lamp of 2000 Watt. SPEKTRA-PROOF is a Trade Mark of Siegfried Theimer GmbH, 6484 Birstein, Obersotzbach, Rohlerstrasse 10, Federal Republic - Germany. Exposure occurred through a step-wedge with a 0.15 constant.

A RAPIDOPRINT DD 1437 (Trade Mark) apparatus was used for processing, the first bath of which contained 1 liter of a 1% sodium hydroxide solution, the second bath 1 liter of water, the third bath 1 liter of 2.5 N of aqueous sulphuric acid to which 75 g of $NaBO_2 \cdot H_2O_2 \cdot 3\,H_2O$ were added, and the fourth bath 1 liter of water.

In Table 1 the number of reproduced steps are given. It is to be noted that in test no. 1 (the control) the photosensitive layer contained only as initiator the oxime ester of formula (A), and no sensitizer was added.

TABLE 1

| No. of the test | No. of the sensitizing compound | No. of reproduced steps |
|---|---|---|
| 1 | — | 1 |
| 2 | 1 | 5 |
| 3 | 2 | 6 |
| 4 | 3 | 12 |
| 5 | 4 | 10 |
| 6 | 5 | 14 |
| 7 | 6 | 6 |
| 8 | 7 | 13 |
| 9 | 8 | 14 |
| 10 | 9 | 14 |
| 11 | 10 | 13 |
| 12 | 11 | 11 |
| 13 | 12 | 14 |
| 14 | 13 | 14 |
| 15 | 14 | 10 |
| 16 | 15 | 12 |

When the sensitizer was used alone i.e. in the absence of the oxime ester, the number of reproduced steps was 0.

EXAMPLE 2

Example 1 was repeated with the difference however, that in the coating composition instead of ketoxime ester (A) a same amount i.e. 15 mg of ketoxime ester (D) was used.

The exposure through the stepwedge of constant 0.15 lasted 30 seconds instead of 20 seconds. In the following Table 2 the number of reproduced steps is given.

TABLE 2

| No. of the test | No. of the sensitizing compound | No. of reproduced steps |
|---|---|---|
| 1 | — | 0 (1 step after an exposure time of 1 min 30 s) |
| 2 | 1 | 1 |
| 3 | 2 | 5 |
| 4 | 3 | 4 |
| 5 | 4 | 4 |
| 6 | 5 | 5 |
| 7 | 6 | 1 |
| 8 | 7 | 5 |
| 9 | 8 | 6 |
| 10 | 9 | 7 |
| 11 | 10 | 9 |
| 12 | 11 | 1 |
| 13 | 12 | 6 |
| 14 | 13 | 6 |
| 15 | 14 | 5 |
| 16 | 15 | 5 |

We claim:

1. A photosensitive composition which comprises a mixture of:
   (1) a photopolymerizable ethylenically unsaturated compound,
   (2) an oxime ester photopolymerisation initiator, and
   (3) at least one sensitizer increasing the photopolymerisation rate of said composition, characterized in that said sensitizer corresponds to one of the following general formulae:

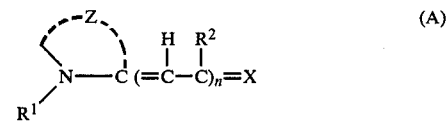

(A)

wherein:
Z represents the necessary atoms to close a nitrogen-containing heterocyclic nucleus and such a nucleus carrying a fused-on aromatic nucleus,
$R^1$ represents hydrogen or an alkyl group,
$R^2$ represents hydrogen, an alkyl group or an aryl group,
X represents oxygen, sulphur, a $C(CN)_2$ group or a heterocyclic ketomethylene nucleus, and
n represents 0 or 1; or

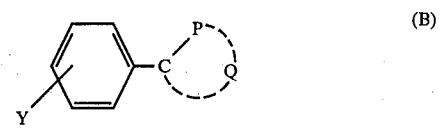

(B)

wherein:
Y represents hydrogen, halogen or a dialkylamino group,
P represents oxygen, NH or N-aryl, and
P and Q represent together the necessary atoms to close a 5-membered unsaturated nitrogen containing heterocyclic nucleus carrying at least one further aryl substituent or carrying a fused-on aryl nucleus,
and wherein a mixture of said oxime ester photopolymerisation initiator and the said photopolymerisation rate increasing sensitizer are present in a ratio by weight of between 1:1 and 10:1 and wherein the said mixture of said oxime ester and sensitizer with respect to the photopolymerisable ethylenically unsaturated compound is present at between 10 and 50 percent by weight.

2. A photosensitive composition according to claim 1, wherein the sensitizer is a merocyanine dye, a zeromethine merocyanine dye, a carbostyril compound, a 1,3-diaryl-2-pyrazolin, a 3,5-diaryl-1,2,4-triazole, a 2,5-diaryloxazole, a 2-arylbenzoxazole, a 2,5-diaryl-1,3,4-oxadiazole or a 4,5-diaryl-4-oxazolin-2-one.

3. A photosensitive composition according to claim 1, wherein the oxime ester corresponds to one of the following general formulae:

and 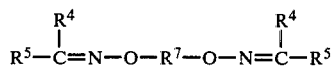

wherein:
$R^4$ represents an alkyl group of 1 or 2 carbon atoms, an aryl group, an alkaryl group, an aralkyl group, a hydroxy-substituted aralkyl group, or an acyl group.
$R^5$ represents a hydrogen atom, an alkyl group of 1 or 2 carbon atoms, an aryl group or an acyl group, or wherein:
$R^4$ and $R^5$ together represent the atoms necessary to form with the adjacent carbon atom a cycloalkyl group, a phenanthrone group, or an indanone group,
$R^6$ represents an acyl group, and
$R^7$ represents a diacyl group.

4. A photosensitive composition according to claim 3, wherein at least one of $R^4$ and $R^5$ is an acyl group.

5. A photosensitive composition according to claim 1, wherein the photopolymerisable ethylenically unsaturated compound is a plurally unsaturated polymerisable compound.

6. A photosensitive composition according to claim 5, wherein the plurally unsaturated polymerisable compound is pentaerythritol triacrylate.

7. A photosensitive composition according to claim 1, wherein the photosensitive composition is in the form of a layer applied onto a support, and contains an alkali-soluble polymeric binding agent.

8. A photosensitive composition according to claim 7, wherein the alkali-soluble binding agent is a copoly (methylmethacrylate-methacrylic acid) having an intrinsic viscosity measured in tetrahydrofuran at 20° C. between 0.05 and 0.20 dl/g, and wherein the ratio by weight between the methyl methacrylate and the methacrylic acid units is between 90:10 and 75:25.

9. A photosensitive composition according to claim 7, wherein the composition is a layer applied on a substantially opaque etchable metal coating on a film support.

10. A photosensitive composition according to claim 1, wherein the photosensitive composition is present in a photosensitive layer comprising a hydrophilic, macromolecular organic polymer dispersion medium including a dispersed phase containing:
(1) at least one ethylenically unsaturated monomer having a boiling point above 100° C. at normal atmospheric pressure and being capable of forming a high polymer by free-radical initiated, chain-propagating addition polymerization, and
(2) in reactive association with said monomer at least one free-radical photoinitiating system as is presented by the combination of said oxime ester and said sensitizer.

* * * * *